(12) United States Patent
Higuchi et al.

(10) Patent No.: US 8,291,360 B2
(45) Date of Patent: Oct. 16, 2012

(54) DATA CONVERSION APPARATUS, METHOD, AND COMPUTER-READABLE RECORDING MEDIUM STORING PROGRAM FOR GENERATING CIRCUIT CONFIGURATION INFORMATION FROM CIRCUIT DESCRIPTION

(75) Inventors: Hayato Higuchi, Kawasaki (JP);
Shinichi Sutou, Kawasaki (JP);
Tsuguchika Tabaru, Kawasaki (JP);
Manabu Matsuyama, Kawasaki (JP);
Ryuichi Ohzeki, Kawasaki (JP);
Toshihiro Suzuki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 344 days.

(21) Appl. No.: 12/503,455

(22) Filed: Jul. 15, 2009

(65) Prior Publication Data

US 2010/0017761 A1    Jan. 21, 2010

(30) Foreign Application Priority Data

Jul. 18, 2008   (JP) .................................. 2008-187620

(51) Int. Cl.
*G06F 17/50* (2006.01)
(52) U.S. Cl. ........ 716/104; 716/100; 716/101; 716/116; 716/117; 716/121
(58) Field of Classification Search .......... 716/100–107, 716/116, 117, 121
See application file for complete search history.

(56) References Cited

U.S. PATENT DOCUMENTS

| 6,915,504 | B2 * | 7/2005 | Okada ........................... 716/104 |
| 7,152,218 | B2 * | 12/2006 | Okada ........................... 716/105 |
| 7,353,162 | B2 * | 4/2008 | Huang et al. .................... 703/23 |
| 2002/0162097 | A1 | 10/2002 | Meribout | |
| 2005/0283768 | A1 | 12/2005 | Ozone | |
| 2008/0092113 | A1 * | 4/2008 | Weinstein et al. ............ 717/106 |
| 2009/0164967 | A1 * | 6/2009 | Masuda ......................... 716/18 |

FOREIGN PATENT DOCUMENTS

| JP | 10-256383 | 9/1998 |
| JP | 2002-123563 | 4/2002 |
| JP | 2006-4345 | 1/2006 |
| JP | 2007-188528 | 7/2007 |

OTHER PUBLICATIONS

Chang et al., Partitioning Sequential Circuits on Dynamically Reconfiguration FPGA, IEEE, Jun. 1999, p. 565-577.*

* cited by examiner

*Primary Examiner* — Nghia Doan
(74) *Attorney, Agent, or Firm* — Fujitsu Patent Center

(57) ABSTRACT

A data conversion apparatus for converting circuit description related to a dynamically-reconfigurable circuit to circuit configuration information, the data conversion apparatus includes a first generation section that generates a data flow graph from the circuit description; a segment count determining section that determines a number of segments for segmenting the data flow graph generated by the first generation section; a virtual circuit creating section that creates a virtual circuit that has as many resources of the dynamically-reconfigurable circuit as the number of the resources multiplied by the number of segments determined by the segment count determining section; a second generation section that generates, from the circuit description, a data flow graph corresponding to the virtual circuit created by the virtual circuit creating section; and a conversion section that allocates and adjusts the resources of the virtual circuit in accordance with the data flow graph.

6 Claims, 19 Drawing Sheets

US 8,291,360 B2

DATA CONVERSION APPARATUS, METHOD, AND COMPUTER-READABLE RECORDING MEDIUM STORING PROGRAM FOR GENERATING CIRCUIT CONFIGURATION INFORMATION FROM CIRCUIT DESCRIPTION

CROSS-REFERENCE TO RELATED APPLICATIONS

This application is based upon and claims the benefit of priority from the prior Japanese Patent Application No. 2008-187620 filed on Jul. 18, 2008, the entire contents of which are incorporated herein by reference.

FIELD

The present invention relates to a data conversion apparatus, a data conversion method, and a program.

BACKGROUND

Japanese Laid-Open Patent Publication No. 2007-188528 describes a dynamically-reconfigurable semiconductor integrated circuit, such as an LSI, that permits dynamic reconfiguration and switching of a circuit configuration as appropriate (hereinafter a "reconfigurable circuit"). One way to realize a reconfigurable circuit is to use a multi-context type circuit.

A reconfigurable circuit of multi-context type has circuit types with certain functions (hereinafter "processing elements" or "PEs"). Such a reconfigurable circuit realizes wired logic by expanding circuit configuration information (hereinafter "context" (plane)) that defines operations of various types of processing elements and connection relations on an LSI, and operates by temporally switching contexts while virtualizing hardware resources.

A functional circuit realized in such a manner must operate in units of contexts and within limitations on the number of switchable contexts. However, settings such as a trigger to switch to another context or the number of processing elements to assign to each context affect performance and efficiency of virtualization.

Data to be processed by a functional circuit in a context is stored in a storage element, such as a register file or internal memory (internal RAM), and data movement between contexts is made via a storage element. Therefore, what is executed in a certain context does not have to be one meaningful task of all functional circuits, and contexts are also used for executing a single large task in a time division multiplex method. Virtualization means that, in context switching in FIG. 18, for example, Context #0 (1800) and Context #1 (1801) are executed while being alternately reconfigured to virtually realize such a functional circuit (or a task) 1900 as shown in FIG. 19.

Control of context switching includes a wide range of functions, such as specifying operations of each processing element, and detecting control relating to information on connection between processing elements or a trigger for switching, i.e., how many cycles to execute, or detecting the termination of context execution. A reconfigurable circuit accordingly requires a control mechanism (hereinafter a "sequencer"), and a dynamic element can be given to a context through the sequencer. The number of context planes that can be executed is commensurate with the reconfiguration memory: when the reconfiguration memory has information equivalent to "n" planes, the maximum number of switchable contexts is "n" planes.

SUMMARY

According to an aspect of the embodiment, a data conversion apparatus for converting an inputted circuit description related to a dynamically-reconfigurable circuit to circuit configuration information, the data conversion apparatus includes a first generation section that generates a data flow graph from the circuit description; a segment count determining section that determines a number of segments for segmenting the data flow graph generated by the first generation section; a virtual circuit creating section that creates a virtual circuit that has as many resources of the dynamically-reconfigurable circuit as the number of the resources multiplied by the number of segments determined by the segment count determining section; a second generation section that generates, from the circuit description, a data flow graph corresponding to the virtual circuit created by the virtual circuit creating section; and a conversion section that allocates and adjusts the resources of the virtual circuit in accordance with the data flow graph generated by the second generation section to generate the circuit configuration information.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
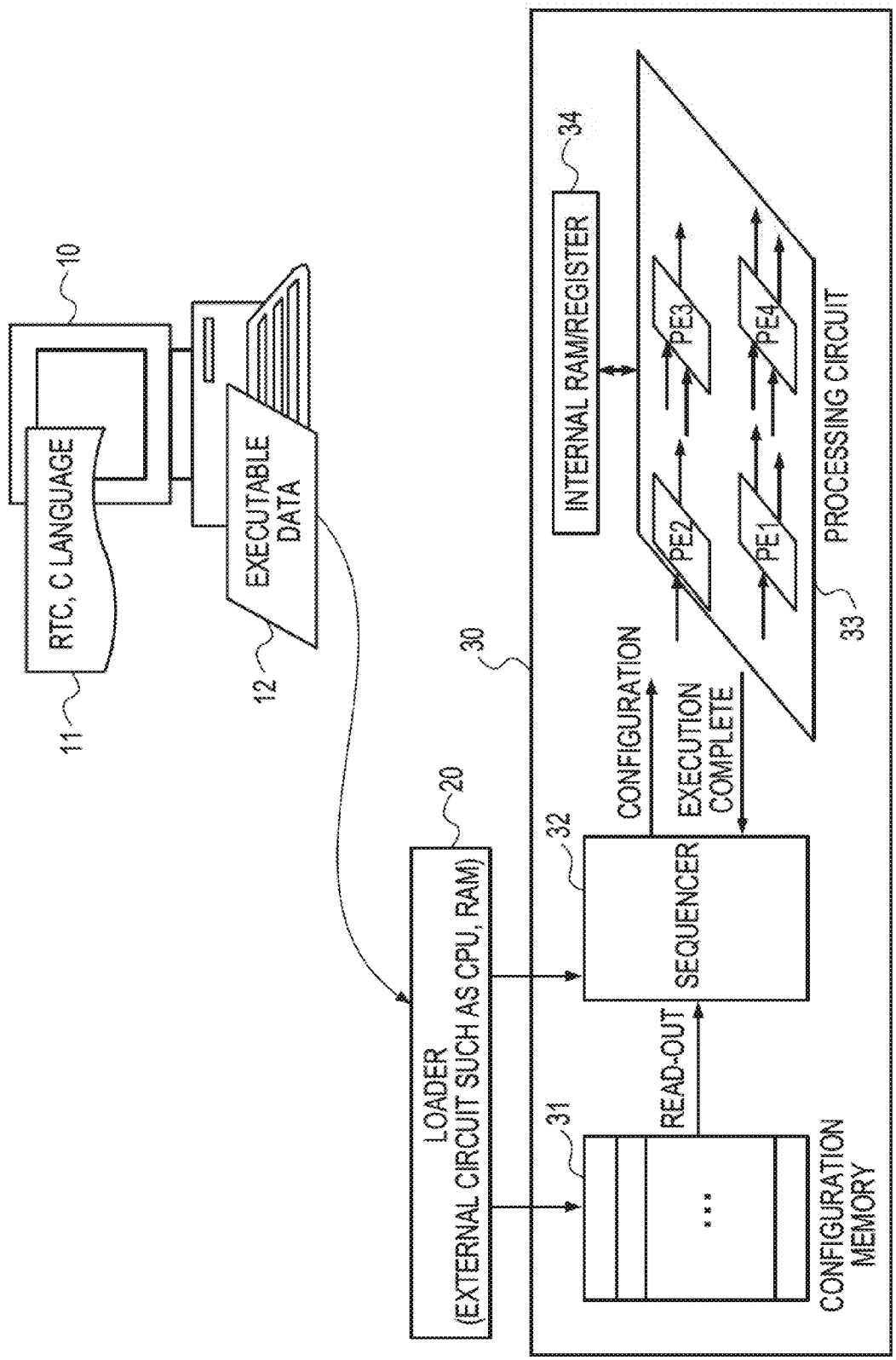
FIG. 1 illustrates a system configuration including a data conversion apparatus according to an embodiment of the present embodiment.

Hereinafter, an embodiment of the present invention will be described with respect to the accompanying drawings.

A data conversion apparatus according to an embodiment of the present invention, which is related to circuit configuration information (or context) supplied to a multi-context type reconfigurable circuit, applies segmentation to pipelined hardware while virtualizing the hardware through context switching with the pipelines maintained so that performance degradation is prevented. Here, pipelined hardware is often represented as a data flow graph (DFG). Hereinafter, a functional circuit that is realized and a data flow graph are treated as the same thing.

To maintain pipelines through context switching, a complicated control is required. Such control is realized through a sequencer provided in a reconfigurable circuit, but has been a significant burden for a developer because the procedures of such control must be provided by the developer. Requirements to be met when segmentation is applied to a data flow graph while maintaining pipelines include the following:

(1) When reuse of a processing element (PE) among contexts is considered, it is required to schedule in which contexts and as which circuits the processing element will behave.

(2) It is necessary to determine the number of segments and a switching cycle in accordance with a physical context.

(3) A data flow graph segmented without adjustment may not fit into a single context as is and there would be variations in PEs used in individual portions of the segmented data flow graph. Therefore, it is required to change the number of segments or modify the data flow graph so that processing elements used are averaged among contexts.

(4) It is necessary to make a schedule or modify data flow graphs so as to maintain temporal consistency with a control that depends on the target reconfigurable circuit and/or a peripheral architecture.

(5) With manipulation and/or modification of (1) to (4), it is required to adjust the timing of data flow graphs so that there will be no inconsistency in the confluence of data (i.e., timing relating to data input or output) and/or dependencies (such as the order of data).

The above requirements are dependent on the maximum number of planes of a reconfigurable circuit and the number of processing elements per context, but virtualization efficiency and performance are in a relation of a tradeoff and it is important according to which policy a data flow graph is to be adjusted while satisfying the requirements (1) to (5).

As context switching is currently performed in large units, such as in units of tasks, the frequency of switching may be once in several to several tens of cycles. Since a multiplicity level is directly related to the throughput of pipelines, the present embodiment switches contexts in as a few cycles as possible in order to reduce the multiplicity level as much as possible to prevent degradation of performance. Hereinafter, a way of segmentation that is aimed at maintaining pipelines and that satisfies the requirements (1) to (5) will also be called "fragmented context switching." In addition, each portion of a segmented context will also be called a "sub-context."

Fragmented context switching may be used when it is desirable to operate a functional circuit that does not fit into a physical configuration that may be utilized once in a reconfigurable circuit. Whether a functional circuit fits into a reconfigurable circuit, that is, whether a desired functional circuit may be mapped or not, is determined by a compiler for reconfigurable circuits. The present embodiment utilizes such tools to estimate and/or change the number of segments.

FIG. 1 illustrates a system configuration including the data conversion apparatus according to an embodiment of the invention.

In FIG. 1, a data conversion apparatus 10 according to the present embodiment is a personal computer, workstation or the like, for example. The data conversion apparatus 10 has a reconfiguration compiler and a program related to fragmented context switching, and generates executable data 12 including circuit configuration information for realizing a desired functional circuit with a reconfigurable circuit 30 based on circuit description 11, which is represented using RTC or C language.

The executable data 12 generated by the data conversion apparatus 10 is supplied to the reconfigurable circuit 30 via a loader 20. The reconfigurable circuit 30 has a configuration memory 31, a sequencer 32, a processing circuit 33, and an internal memory (RAM)/register 34.

A context (or circuit configuration information) input via the loader 20 is stored in the configuration memory 31. The sequencer 32 reads the context (or circuit configuration information) from the configuration memory 31 and supplies the context to the processing circuit 33. Upon receiving a notification that execution has been completed from the processing circuit 33, the sequencer 32 reads the next context (or circuit configuration information) from the configuration memory 31 and supplies the next context to the processing circuit 33.

The processing circuit 33 has a plurality of processing elements and dynamically reconfigures circuit configuration in accordance with a context (or circuit configuration information) supplied from the sequencer 32. The internal memory/register 34 is for storing data to be processed by a functional circuit in a context, and data movement between contexts is realized using the internal memory/register 34.

Figure 2:
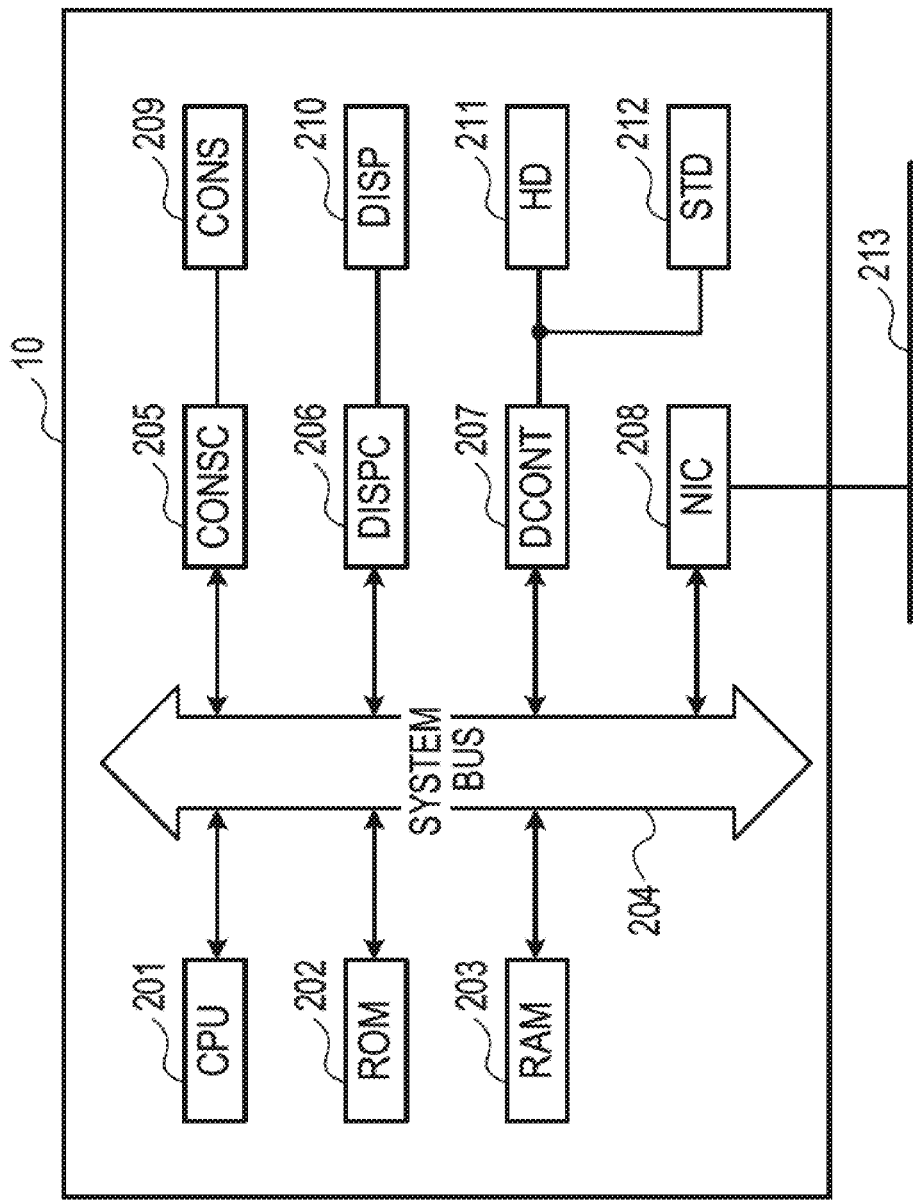
FIG. 2 illustrates hardware configuration of the data conversion apparatus according to the embodiment.

FIG. 2 illustrates an example hardware configuration of the data conversion apparatus 10 according to the present embodiment.

As illustrated in FIG. 2, the data conversion apparatus 10 has a configuration in which a CPU 201, ROM 202, RAM 203, a controller (CONSC) 205 for a console section (CONS) 209, a display controller (DCONT) 206 for a display (DISP) 210 as a display section, a controller (DCONT) 207 for a storage device (STD) 212, such as a hard disk (HD) 211 and a flexible disk, and a network interface card (NIC) 208 are connected to each other via a system bus 204 such that they may communicate with each other.

The CPU 201 executes software (or a program) stored in the ROM 202 or HD 211 or software (or a program) supplied from the STD 212 to centrally control individual components connected to the system bus 204. That is to say, the CPU 201 reads and executes a processing program for performing such processing operations as described below from the ROM 202, the HD 211, or the STD 212 to perform control for realizing data conversion operations discussed below. The RAM 203 functions as main memory or a work area for the CPU 201.

The CONSC 205 controls instruction inputs from the CONS 209 or a pointing device or the like not shown. The DISPC 206 controls display on the DISP 210. The DCONT 207 controls access to the HD 211 and the STD 212, which store a boot program, various application programs, user files, a network management program, and a processing program for use in the data conversion operations discussed below, or the like. The NIC 208 bi-directionally exchanges data with other apparatuses on the network 213.

Figure 3:
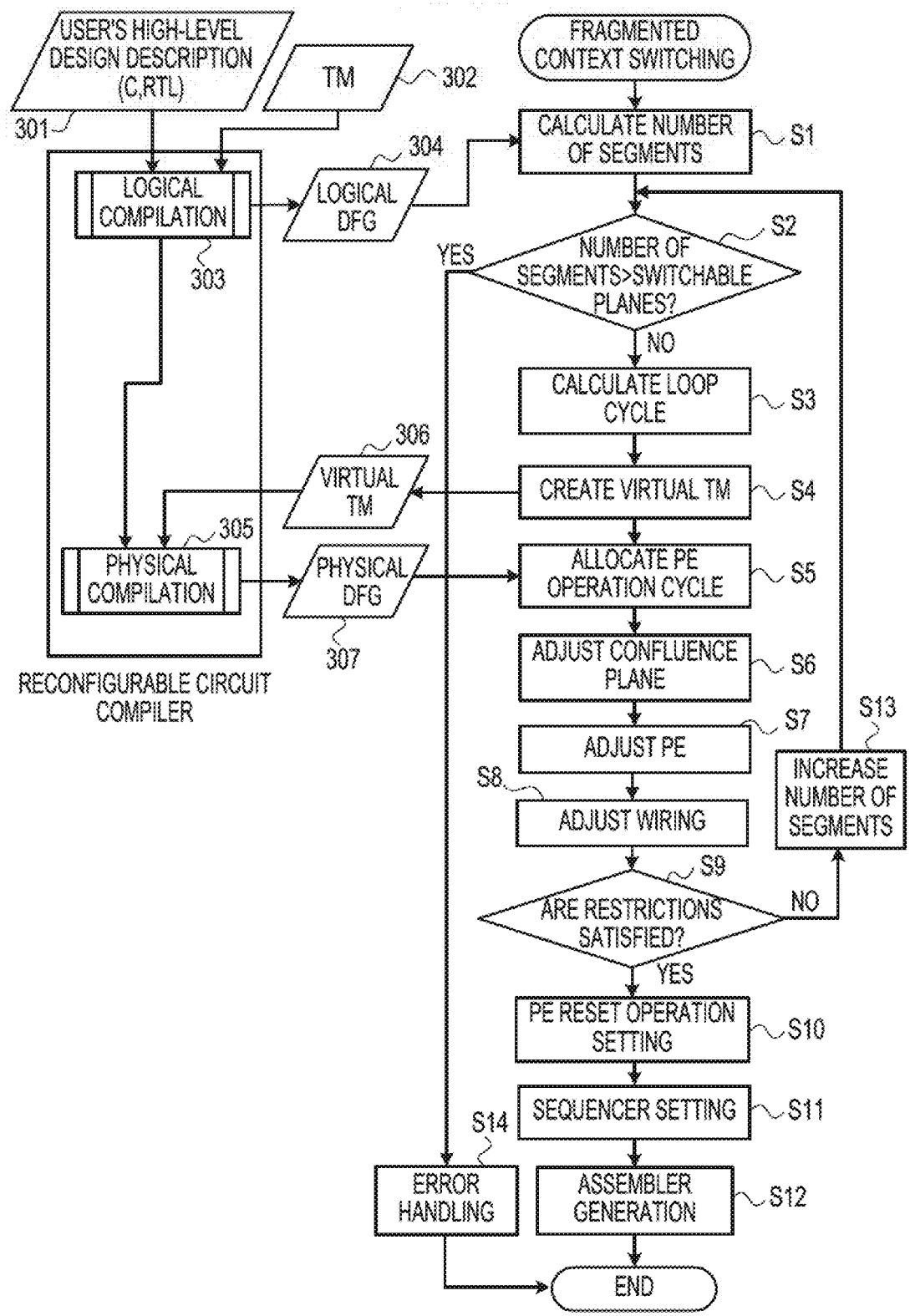
FIG. 3 is a flowchart illustrating a processing operation example of the data conversion apparatus according to the embodiment.

FIG. 3 is a flowchart illustrating an example of processing operations of the data conversion apparatus 10 in the present embodiment. FIG. 3 illustrates a processing procedure of a simple fragmented context switching. Hereinafter, each step of the procedure shown in FIG. 3 will be described.

(Logical Compilation 303 and Physical Compilation 305)

To convert a user's high-level design description by C language or RTL into a data flow graph, for example, an existing compiler for reconfigurable circuits may be utilized.

Logical compilation 303 is compilation that is performed on the assumption that there is no limitation on the number of processing elements and wiring networks. The logical compilation 303 converts a user's design description 301 into a logical data flow graph 304 that uses processing element information of a target reconfigurable circuit (or a target machine) 302. Therefore, the logical data flow graph 304 is a hardware representation with mild restrictions that is less dependent on architecture in relation to a reconfigurable circuit. If there is no error in description rules in the design description, the logical data flow graph 304 is generated through the logical compilation 303.

The physical compilation 305 converts a user's design description 301 to a physical data flow graph 307 with limitations on the number of processing elements of an actual reconfigurable circuit and/or a wiring network. The physical data flow graph 307 is a hardware representation that represents operations in a reconfigurable circuit. The following description of the processing procedure assumes that the logical compilation 303 and the physical compilation 305 utilize a known compiler for reconfigurable circuits.

(Calculation of the Number of Segments: S1)

When the logical data flow graph 304 does not fit into a physical context, time division multiplexing is performed, in which case it is preferable to determine into how many portions the data flow graph is to be segmented, that is, into how many planes the data flow graph is to be folded. For example, when the logical data flow graph 304 requires the use of twice as many processing elements as those of the physical context, the logical data flow graph 304 is preferably folded into at least two planes. Since conversion of the design description 301 to the physical data flow graph 305 discussed below involves a problem of circuit deployment and wiring, a solution is more likely to be obtained when the number of segments is made larger. Therefore, for example, the number of segments may be calculated by multiplying the number by a coefficient so the number may at least satisfy the number of minimum processing element resources required, or the number of segments may be specified by the user.

Figure 4:
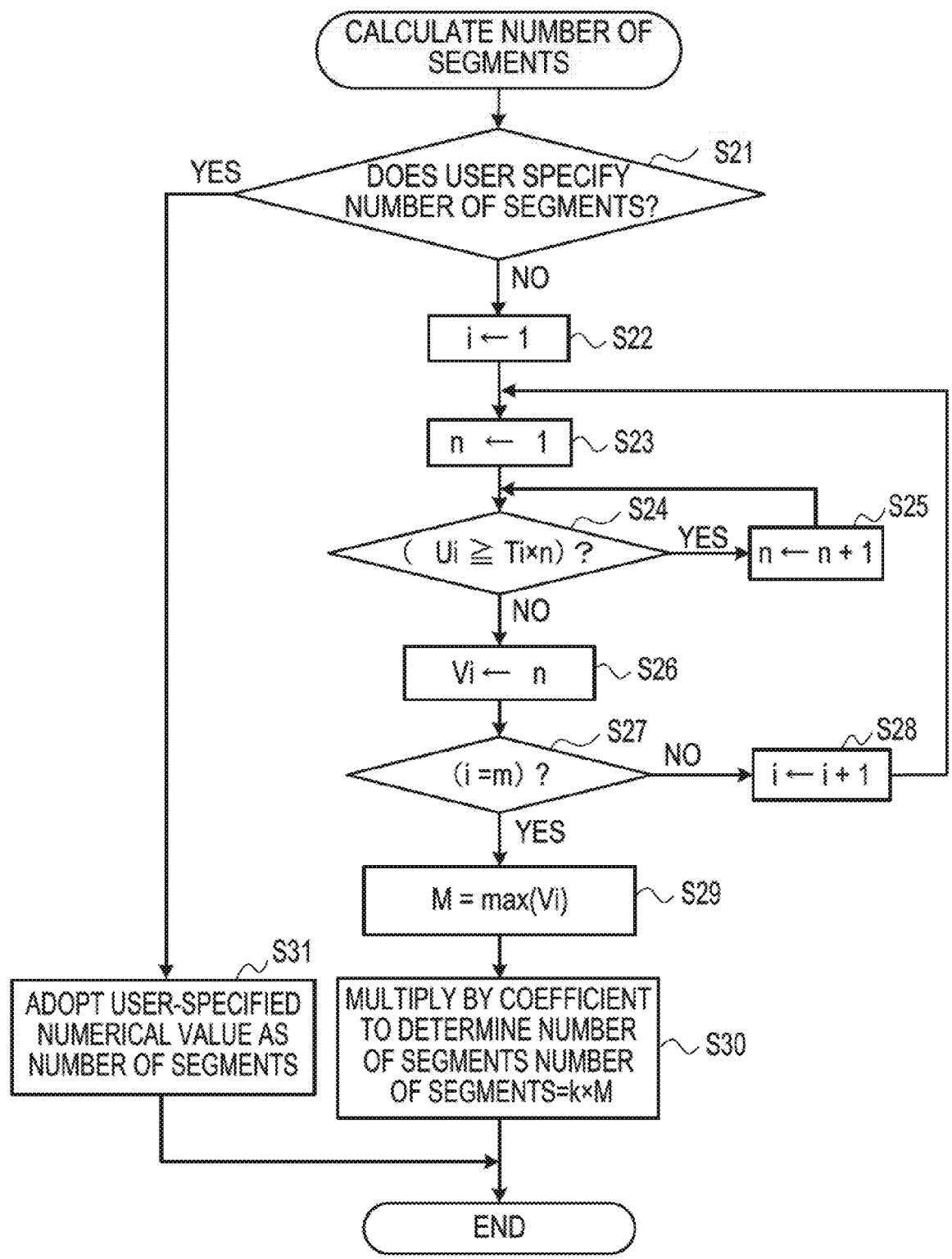
FIG. 4 is a flowchart illustrating an example procedure of calculating the number of segments in the embodiment.

An example of a procedure of calculating the number of segments is illustrated in FIG. 4.

First, the CPU 201 determines whether the user specifies the number of segments or not (S21). If the user specifies the number of segments, a numerical value specified by the user is adopted as the number of segments (S31), and processing is terminated.

On the other hand, if the user does not specify the number of segments, the CPU 201 assigns 1 to a variable "i" (S22). Here, the variable " " is 1, 2, . . . , m, where "m" is the total number of processing element types.

Then, the CPU 201 assigns 1 to a variable "n" (S23), and determines whether or not the number of processing elements "Ui" that is required by the logical data flow graph 304 is equal to or greater than a product of the number of processing elements per context "Ti" that may be actually used and the variable "n". If the number of processing elements "Ui" is equal to or greater than Ti×n, the variable "n" is incremented by one (S25), and the flow returns to step S24. On the other hand, if the number of processing elements "Ui" is less than the value of Ti×n, the current value of variable "n" is assigned as value "Vi" (S26).

Next, the CPU 201 determines whether the variable "i" is equal to the value "m" or not, that is, whether the value "Vi" has been determined for processing elements of all types or not (S27). If the variable " " is not equal to the value "m", the CPU 201 increments the value of variable " " by one (S28), and returns to step S23, where the CPU 201 repeats the above-described processing until the value "Vi" is determined for processing elements of all types.

When the CPU 201 determines that the variable " " is equal to value "m" that is, the value "Vi" has been determined for processing elements of all types, the CPU 201 identifies the maximum value of values "V1" to "Vm" (S29). The CPU 201 further multiplies the value identified at step S29 by a coefficient "k" to determine the number of segments (S30), and terminates processing. Here, the coefficient "k" is a value equal to or greater than 1 and is multiplied to give a margin to the number of resources of processing elements. Note that the value identified at step S29 may be set as the number of segments without multiplying by the coefficient "k".

(Determination of the Number of Segments: S2)

Whether the number of segments obtained in the calculation of the number of segments S1 is equal to or less than the number of context-switchable planes (i.e., whether the context may be stored in the configuration memory) is determined. If the number of segments obtained in the calculation of the number of segments S1 is greater than the number of context-switchable planes, the data flow graph does not physically fit into the context, thus error handling S14 is performed and processing is terminated.

(Calculation of Loop Cycle: S3)

When the logical data flow graph 304 contains a loopback, it is preferable to make the confluence point of the data flow graph coincide with the current sub-context. Therefore, the number of segments and a context operation cycle are dependent on the cycle of pipeline loop execution. Accordingly, a loop cycle calculation determines the cycle of sub-context execution so that the confluence point coincides with the sub-context.

While the cycle may be determined in a number of ways, some examples of a calculation method is illustrated below. The example below is merely an example and is not a limitation.

(1) When there is only one multiple loop or when the cycles of all pipeline loops are the same (1-a) When the number of segments is a divisor of the cycles of pipeline loops Context switching is performed every cycle. It is assumed that a folding cycle (e.g., the number of cycles to make a circuit of all sub-contexts) is equal to the number of segments. For example, when a pipeline loop cycle is eight cycles and the number of segments is four, the folding cycle is four.

(1-b) When the number of segments is less than a divisor of the pipeline loop cycles that is greater than 1

The folding cycle is set to the minimum divisor of the pipeline loop cycle that is greater than the number of segments. For example, when the pipeline loop cycle is eight cycles and the number of segments is three, the folding cycle is four. In this case, any one of three sub-contexts will be executed in two cycles. In some cases, the execution time may be adjusted for each sub-context in such a way.

(1-c) When the number of segments is greater than the pipeline loop cycle

The pipeline loop cycle is made equal to the number of segments and the context is switched every cycle. For example, when the number of segments is seven, an adjustment is made so that the pipeline loop cycle becomes seven cycles even if the pipeline loop cycle is six or less.

(2) When the greatest common divisor of all pipeline loop cycles is greater than one (2-a) When the number of segments is a common divisor Context switching is performed every cycle. Otherwise, processing is similar to (1-a).

(2-b) When the number of segments is less than a common divisor that is greater than one The smallest of the common divisors greater than the number of segments is adopted as the folding cycle. Processing is otherwise similar to (1-a).

(2-c) Other Cases

Cycles of other loops are matched to the loop with the longest cycle. Otherwise, processing of (1) is performed.

(3) Other Cases

Cycles of other loops are matched to the loop with the longest cycle. Otherwise, (1) is applied.

The pipeline loop cycle may also be specified by the user, and when scheduling is possible with that cycle, the cycle may be adopted as the cycle of pipeline loops before adjustment. For example, by the user specifying the number of segments and the cycle of pipeline loops in the case of (3), the case (3) may be converted to the case of (2-a) or (2-b) and performance may be controlled to a certain extent.

(Creation of a Virtual Target Machine (or a Virtual TM): S4)

A target machine refers to architecture information for a reconfigurable circuit as the target and mainly includes information necessary for dynamic reconfiguration. A virtual target machine 306 is a target machine that is defined as a virtual large space expected for the processing elements and the wiring (network) for the processing elements from the fragmented context switching, and is calculated from a physical target machine and the number of segments. Simply put, as many virtual target machines as the number of the resources multiplied by the number of segments are obtained.

In creation of a virtual target machine, calculation for processing elements that may be virtualized and ones that cannot is preferably performed separately. For example, a computing unit that is reused among sub-contexts may be virtualized, whereas a register or RAM that maintains values across a number of contexts cannot be virtualized.

(Conversion to a Physical Data Flow Graph Physical Compilation): 305)

In physical data flow graph conversion, a data flow graph that operates for the virtual target machine 306 is generated (also referred to as compilation using the virtual target machine 306). Since physical data flow graph conversion involves deployment and wiring unlike logical data flow graph conversion, deployment and wiring may not be completed, that is, a solution may not be obtained. In such a case, a solution is easier to be obtained by increasing the number of segments to create a still larger virtual target machine and then performing the physical compilation 305.

(Allocation of PE Operation Cycle: S5)

Allocation of a processing element (PE) cycle is the scheduling of an operation cycle of processing elements, that is, specifying in which sub-context each processing element of the physical data flow graph 307 is preferably executed. This is uniquely determined from the number of segments and the switching cycle determined earlier.

(Sub-Context Adjustment: S6)

In a physical data flow graph with allocated operation cycles, cycles may not coincide with each other at a confluence point. In other words, there may be an inconsistency in timing of data input and output. This may be adjusted by inserting a delay or the like.

(PE Adjustment: S7)

Since a sub-context may only use resources of processing elements of an actual target machine, a sub-context for which processing elements run short may be generated as a result of the PE operation cycle allocation in S5. This results from variations in processing elements used among contexts. Also in this case, adjustment may be made with delays because insertion of a delay may move a processing element into another sub-context.

(Wiring Adjustment and Determination; S8, S9, and S13)

As the adjustment described above has modified the original physical data flow graph, wiring or the like also may be accordingly adjusted (S8). It is again determined whether hardware restrictions are satisfied with the adjustment of the sub-context, PEs, and wiring (S9). If the hardware restrictions are not satisfied, recompilation is performed by making a virtual target machine larger (increasing the number of segments) or the like (S13).

(PE Reset Operation Setting, Sequencer Setting, and Assembler Generation: S10, S11, and S12)

In PE reset operation setting, a processing element that is not being used in a sub-context is set to a reset state so that the processing element does not malfunction.

In sequencer setting, the data flow graph to which various adjustments have been made as mentioned above and PE reset setting are set as sequencer control. In other words, the sequencer setting sets at which point information is to be written when hardware is realized.

In assembler generation, sequencer settings are converted to an assembly language that may be interpreted by an assembler for reconfigurable circuits.

According to the present embodiment, by performing physical compilation using a virtual target machine, which is as many as the number of the resources multiplied by the number of segments with respect to a real target machine, and thereafter performing adjustment of the sub-context, PEs, and wiring, it is possible to improve utilization efficiency of processing elements or the like when a desired functional circuit configuration is realized. Also, with automatic conversion to a data flow graph appropriate for context switching using a data conversion apparatus, the burden on the user may be reduced.

An example of data conversion in the present embodiment is illustrated. In the following, description will be given on a case where no loopback exists in a data flow graph and a case where a loopback exists in a data flow graph.

(An Example with No Loopback)

Figure 5A:
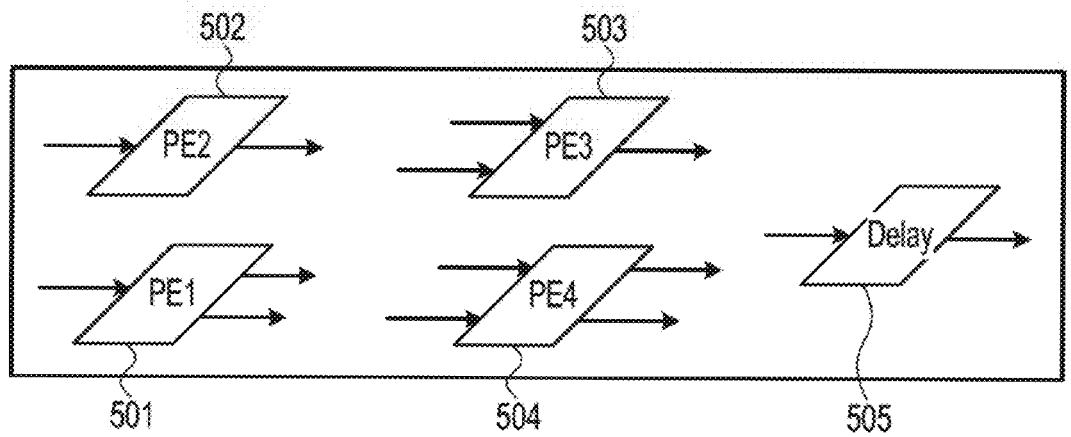
FIG. 5 illustrates examples of a real target machine according to the embodiment.
Figure 5B:
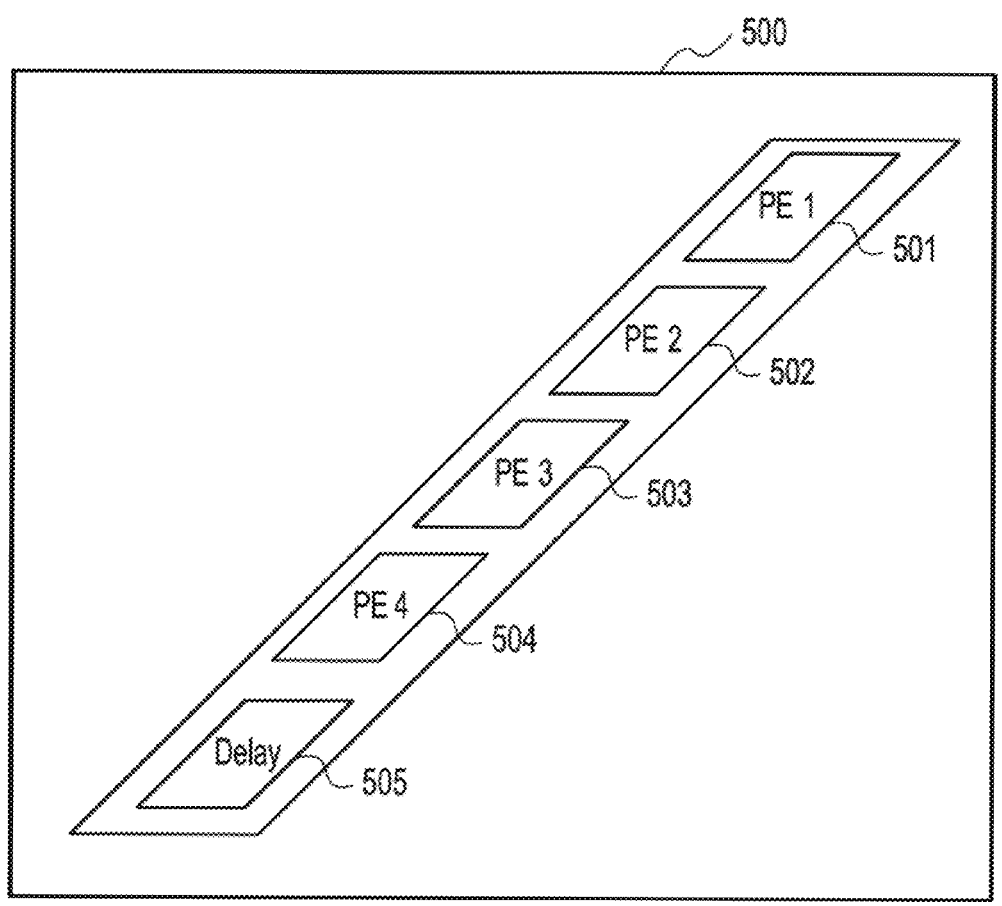

Assume that a certain reconfigurable circuit has a real target machine 500 that is composed of processing elements 501, 502, 503, 504, and 505 shown in FIGS. 5A and 5B as one context. It is assumed that the processing elements 501 to 505 shown in FIG. 5A all output a processing result in one cycle and especially the processing element denoted as "Delay" is a one-input-one-output processing element that provides a one-cycle delay. The real target machine 500 shown in FIG. 5B indicates that it has each one of the processing elements 501 to 505 shown in FIG. 5A.

Figure 6:
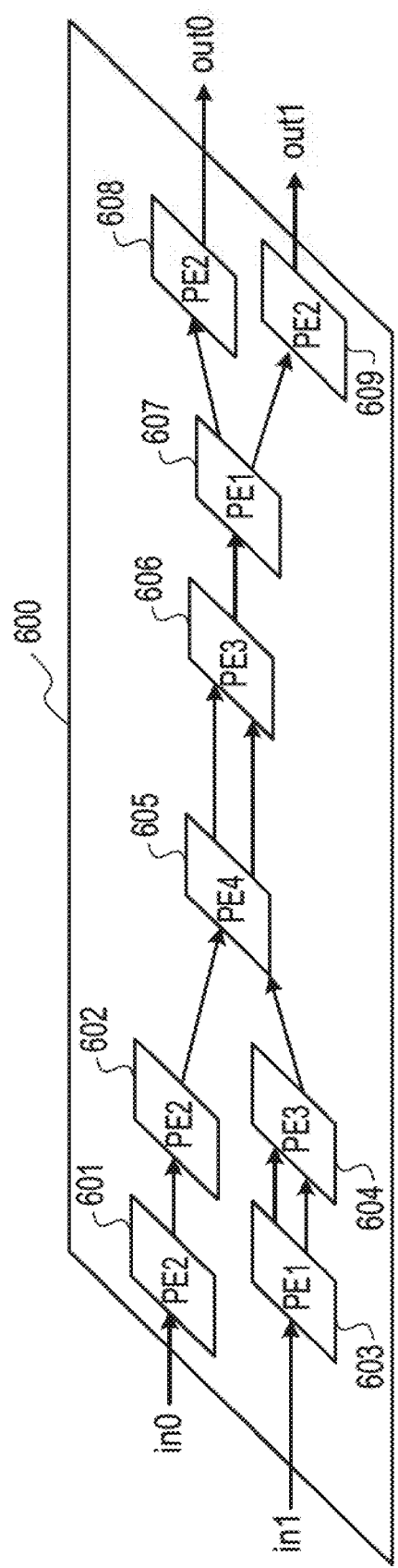
FIG. 6 is a data flow graph for illustrating an example of data conversion in the embodiment.

Here, consider a logical data flow graph 600 composed of processing elements 601 to 609 illustrated in FIG. 6 that is operated in a reconfigurable circuit. Because the circuit scale of the logical data flow graph 600 is larger than the real target machine 500, the logical data flow graph 600 is preferably segmented into a plurality of contexts by context switching.

Figure 7:
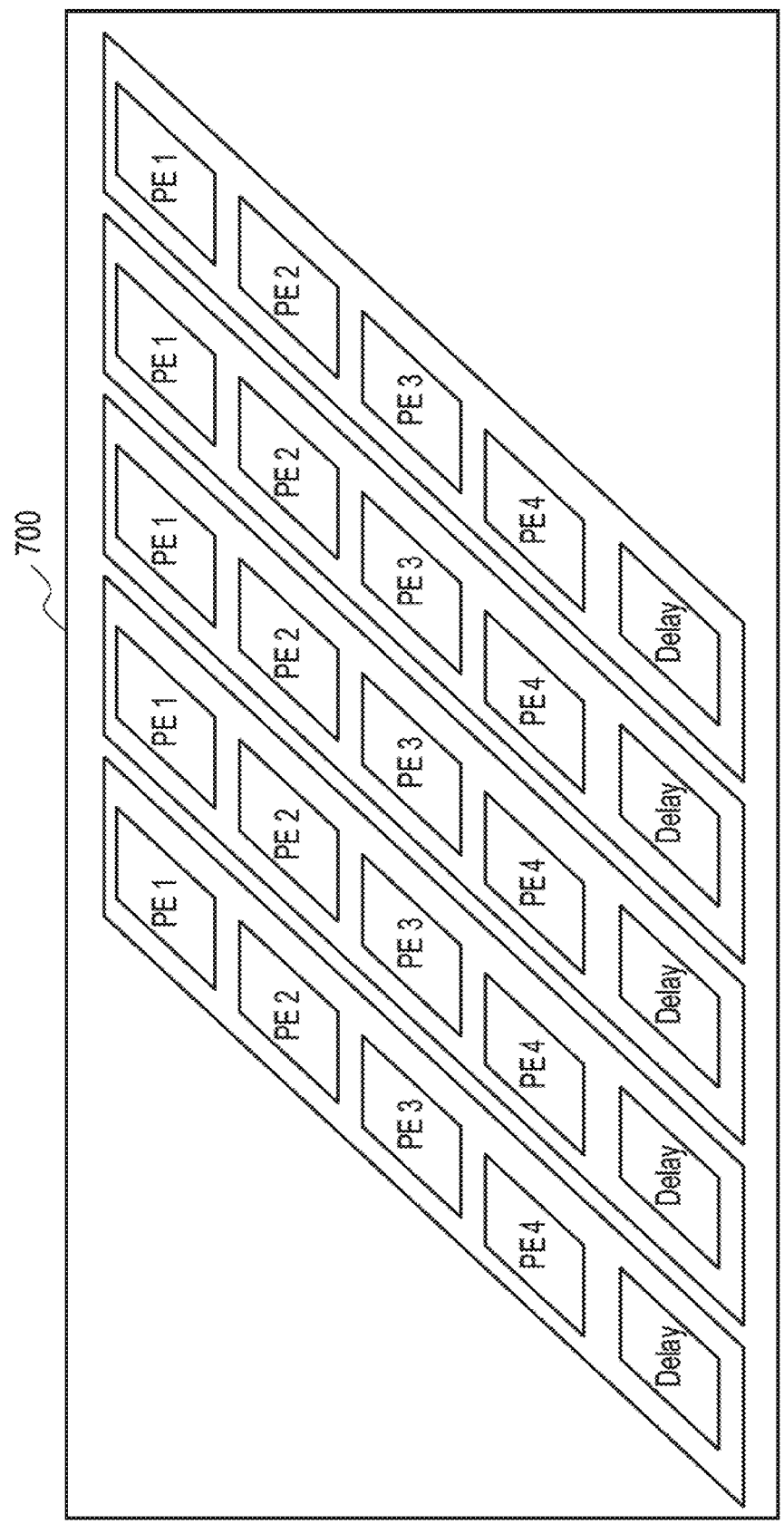
FIG. 7 is an example of a virtual target machine in the embodiment.

Paying attention to the processing element that is most frequently used in the logical data flow graph 600 (i.e., PE2), a target machine at least four times as large as the real target machine is desired. Therefore, the present example assumes a virtual target machine 700 as illustrated in FIG. 7 that is equivalent to four times the real target machine 500. That is, the number of segments is four and contexts corresponding to four planes are used. Also, assume that it is guaranteed that the data flow graph of FIG. 6 may be realized on the virtual target machine 700 shown in FIG. 7 through physical compilation.

Figure 8:
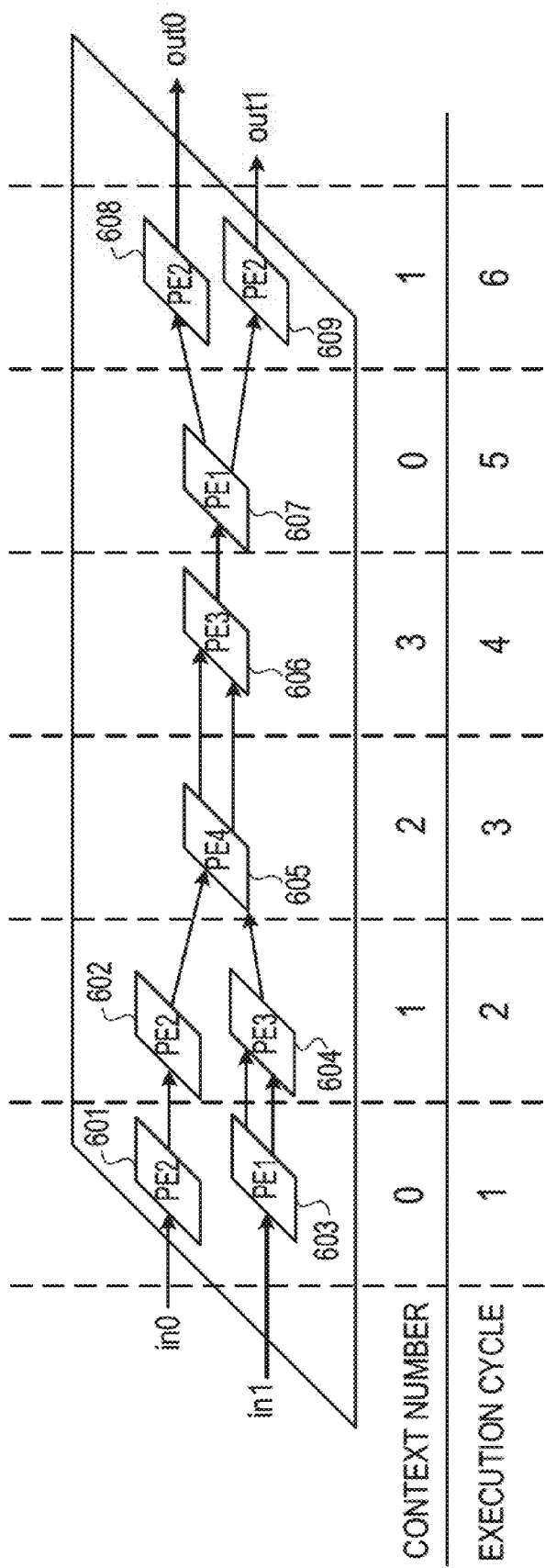
FIG. 8 is a diagram for illustrating an example of data conversion in the embodiment.

Next, PE operation cycle allocation is performed. Because an operation is completed in one cycle and no loopback is contained in all of the processing elements used in the data flow graph 600 illustrated in FIG. 6, this pipeline hardware permits data input in every cycle. Therefore, contexts are also switched every cycle. When the number of segments is four and the switching cycle is every cycle, the PE operation cycles are allocated as shown in FIG. 8.

Note that the context number starts at 0. It is also assumed that control of context switching starts at context number 0 and returns to context number 0 when context number 3 has been reached.

Figure 9:
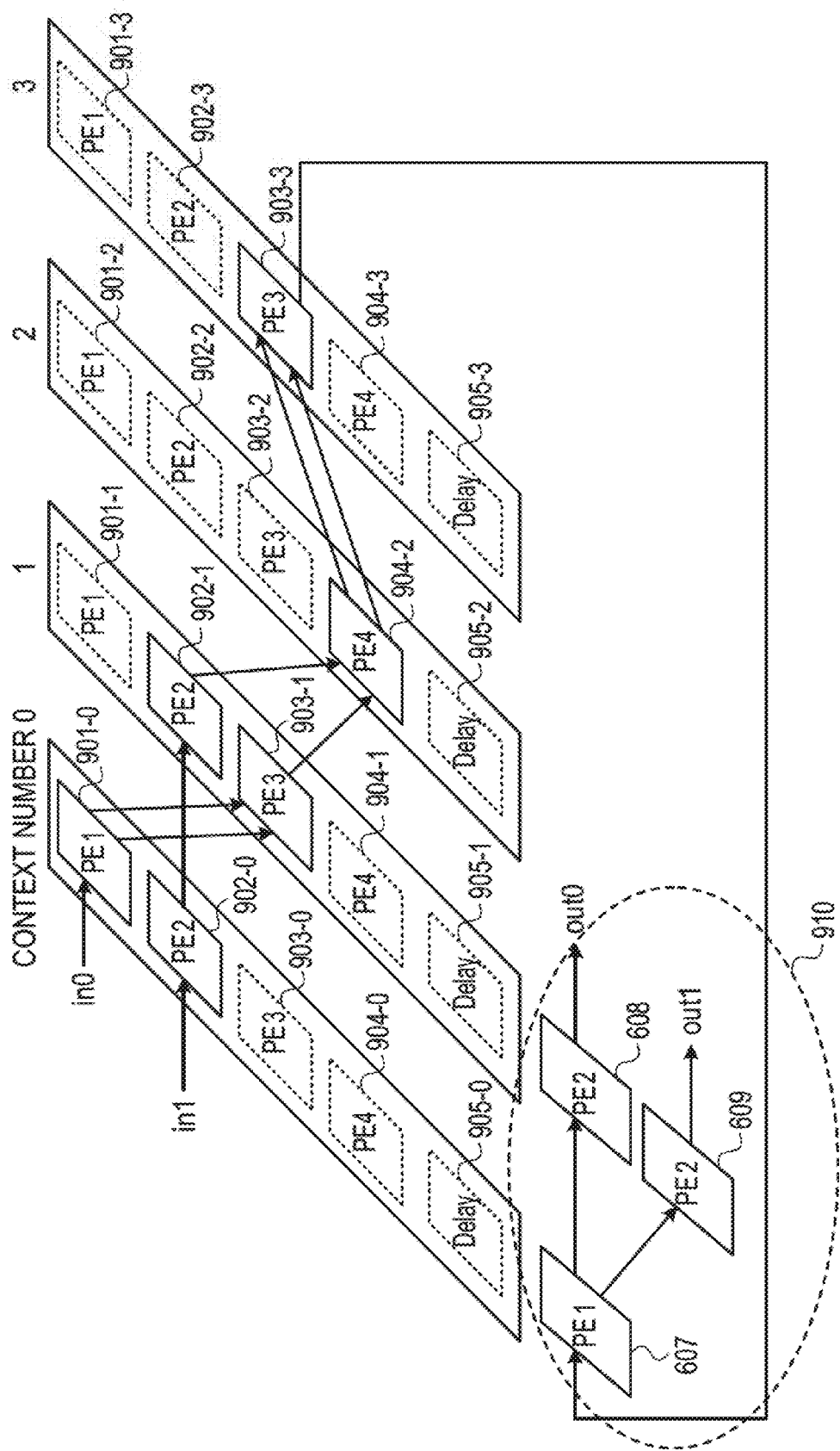
FIG. 9 is a diagram for illustrating an example of data conversion in the embodiment.

After the operation cycle is determined, a context in which to execute a processing element is allocated starting from the first processing element in the data flow graph. When the virtual target machine 700 illustrated in FIG. 7 is divided into four contexts and the contexts are allocated in accordance with the operation cycle and context number illustrated in FIG. 8, the result is as illustrated in FIG. 9.

In context number 0, PE1 (901-0) and PE2 (902-0) that operate in operation cycle 1 and PE1 (607) that operates in operation cycle 5 are positioned, but only one PE1 may be positioned in context number 0. Therefore, PE1 (607) that operates in operation cycle 5 is regarded as a processing element that does not fit into a context. Conversely, PE3 (903-0), PE4 (904-0), and Delay (905-0) are not used in context number 0; they are regarded as unused processing elements.

Similarly, in context number 1 as well, two PE2s (608 and 609) do not fit in a context, and PE1 (901-1), PE4 (904-1), and Delay (905-1) are unused.

Next, as to sub-contexts, attention is paid to processing elements that have a confluence in relation to input, such as PE3 and PE4, and whether the input timings of such elements coincide with each other or not is checked. Since there is no displacement between cycles in this example, no adjustment is required.

Figure 10:
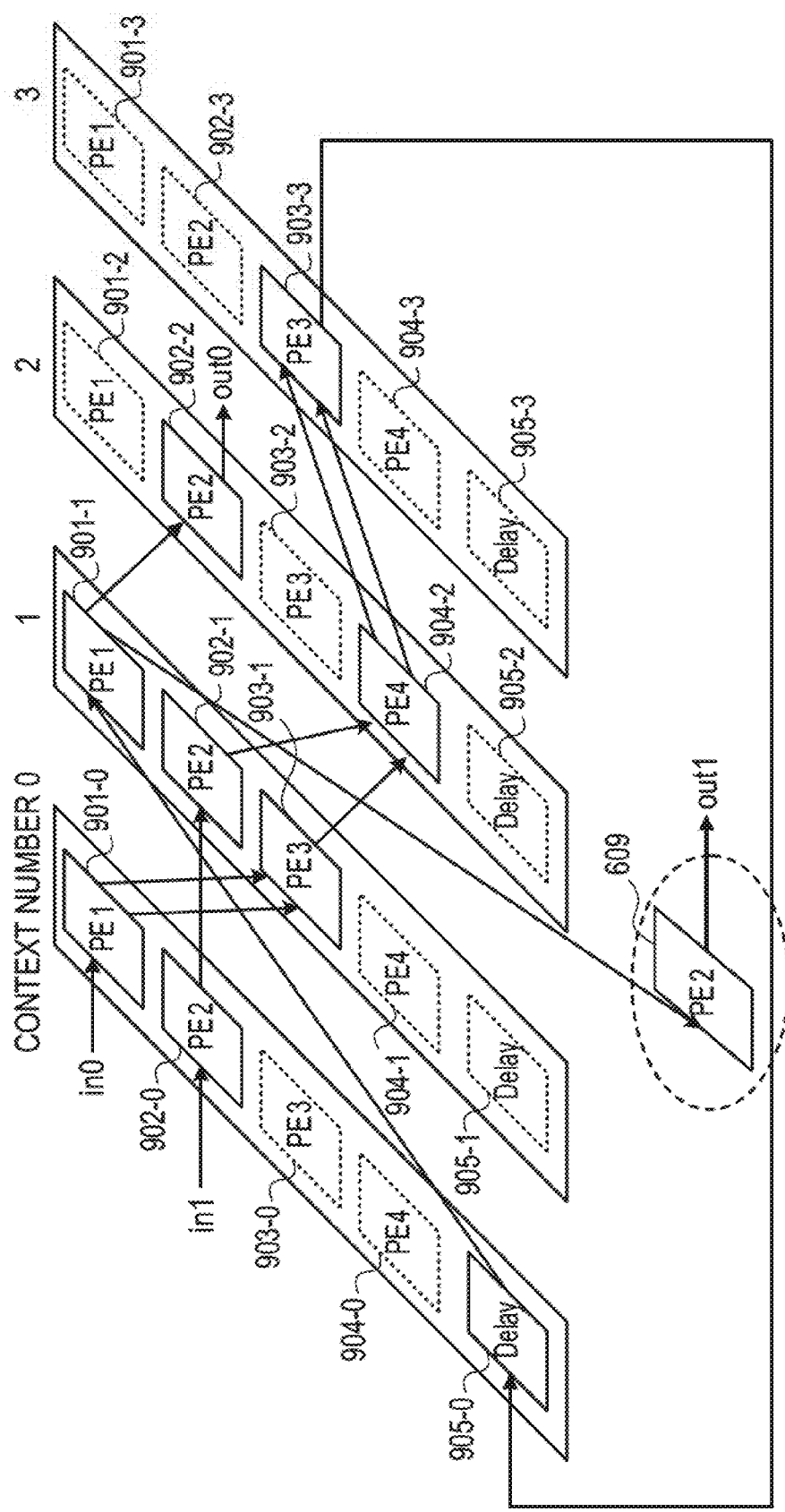
FIG. 10 is a diagram for illustrating an example of data conversion in the embodiment.
Figure 11:
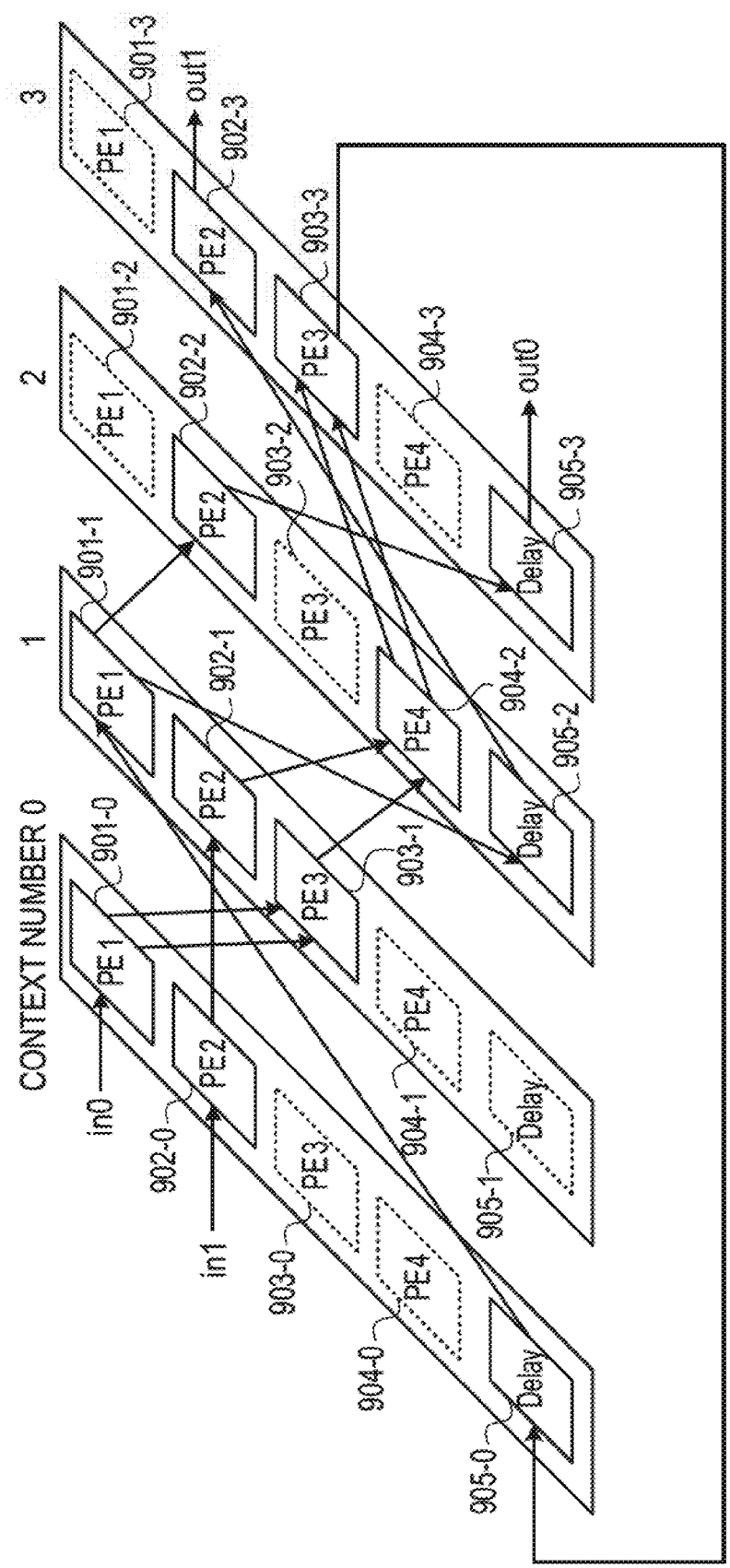
FIG. 11 is a diagram for illustrating an example of data conversion in the embodiment.

Next, a PE adjustment is performed. In context number 0 in FIG. 9, one PE1 (607) is lacking, but PE1 (901-1) is unused in context number 1. Thus, efficiency of use is improved by moving the PE1 (607) that does not fit into the context of context number 0 to context number 1 (FIG. 10). To that end, as illustrated in FIG. 10, a delay for PE adjustment is inserted using Delay (905-0). Since processing elements are moved at subsequent phases as well, adjustment is then made to such processing elements at subsequent phases. In the present example, as illustrated in FIG. 11, processing elements that do not fit into a context are eliminated by inserting a delay at two positions, Delay (905-0) and Delay (905-2). However, this adjustment misaligns output timings of two outputs, out0 and out1, thus a further adjustment delay is inserted using Delay (905-3) to make the outputs timings coincide with each other.

Next, adjustment of wiring is performed. As illustrated in FIG. 11, wiring that connects contexts with each other may be limited depending on the configuration of a wiring network, and wiring resources may run short in the same way as the PE adjustment. However, such a shortage may also be adjusted by inserting a delay, and description is omitted here and it is assumed that there are sufficient wiring resources.

While a Delay is used for delays in the adjustments so far, if there are not enough Delays and adjustment becomes impossible, the number of segments may be increased to re-create a virtual target machine.

Figure 12:
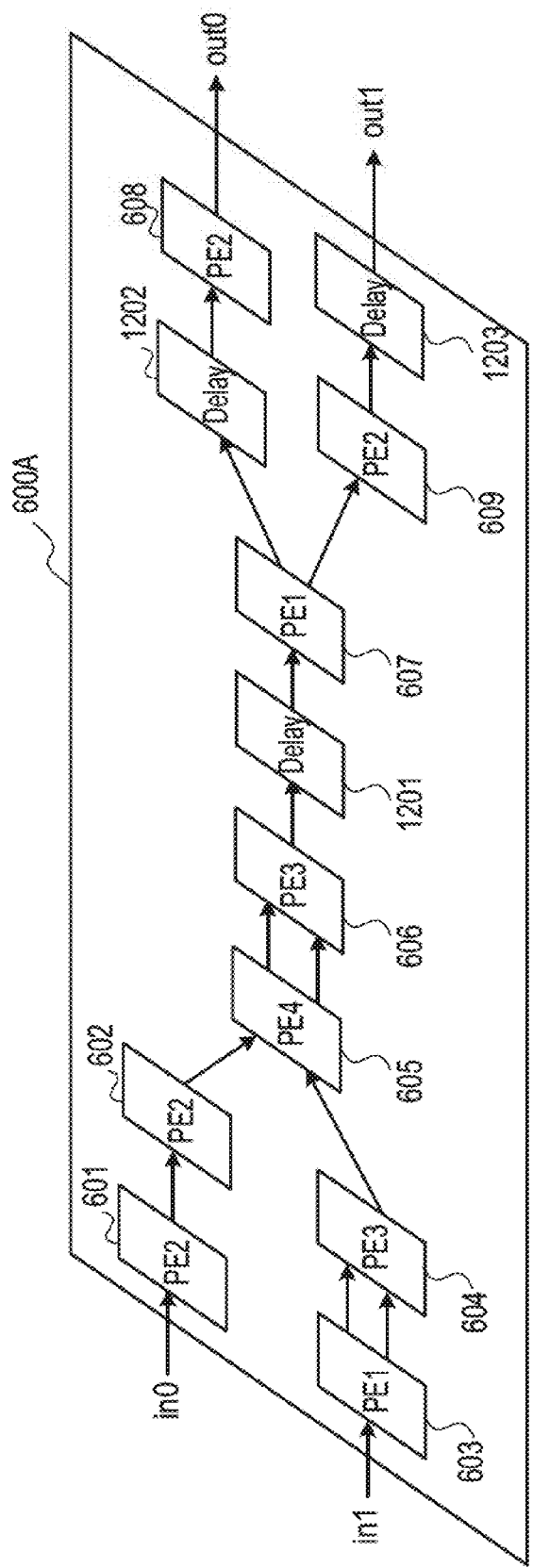
FIG. 12 is a data flow graph for illustrating an example of data conversion in the embodiment.

The adjustments so far result in a data flow graph 600A as illustrated in FIG. 12 that permits context switching and is composed of processing elements 601 to 609 and Delays 1201 to 1203 for delay adjustment. As a result, the data flow graph 600 shown in FIG. 6 has been converted to the data flow graph 600A in FIG. 12 through delay insertion. In the data flow graph in FIG. 12, data may be input once in four cycles through context switching.

Next, the PE reset operation setting is performed. The unused processing elements 901-2, 901-3, 903-0, 903-2, 904-0, 904-1, 904-3, and 905-1 illustrated in FIG. 11 are subjected to resetting so that the processing elements do not inherit settings for PEs that have operated in other cycles.

Finally, an assembler that sets all the operation settings described above in a sequencer is generated.

(An Example with a Loopback)

Figure 13A:
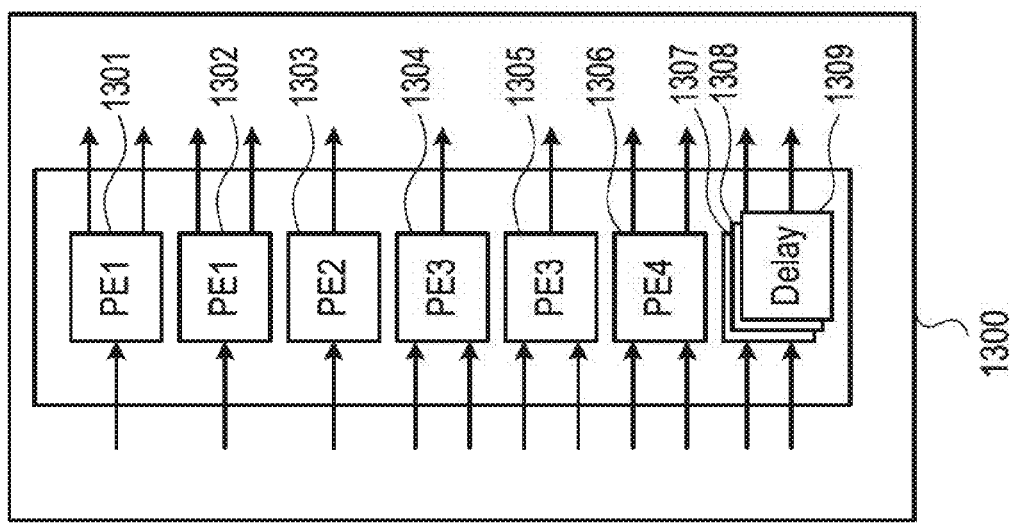
FIG. 13 illustrates other examples of real and virtual target machines in the embodiment.

The types of processing elements are similar to those of when there is no loopback described above. The example below assumes that the real target machine is a real target machine 1300 that is composed of two PE1s (1301 and 1302), one PE2 (1303), two PE3s (1304 and 135), one PE4 (1306), and three Delays (1307, 1308, and 1309) as illustrated in FIG. 13A. Note that the Delays (1307, 1308, 1309) are depicted on top of each other in the figure.

Figure 13B:
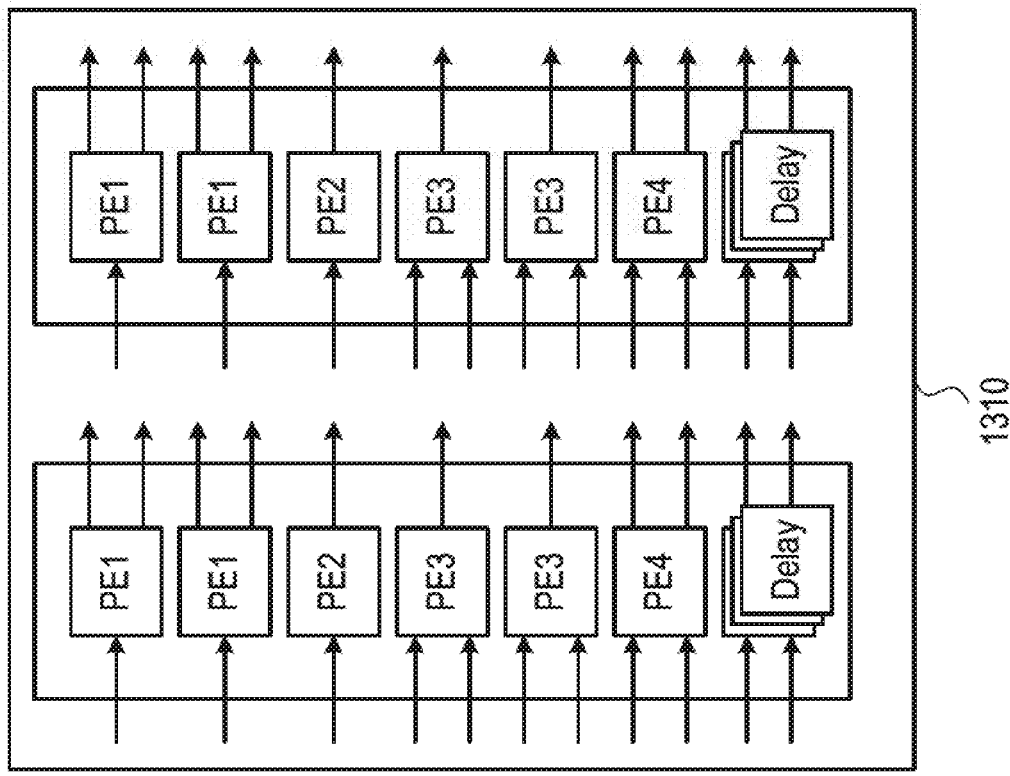
Figure 14:
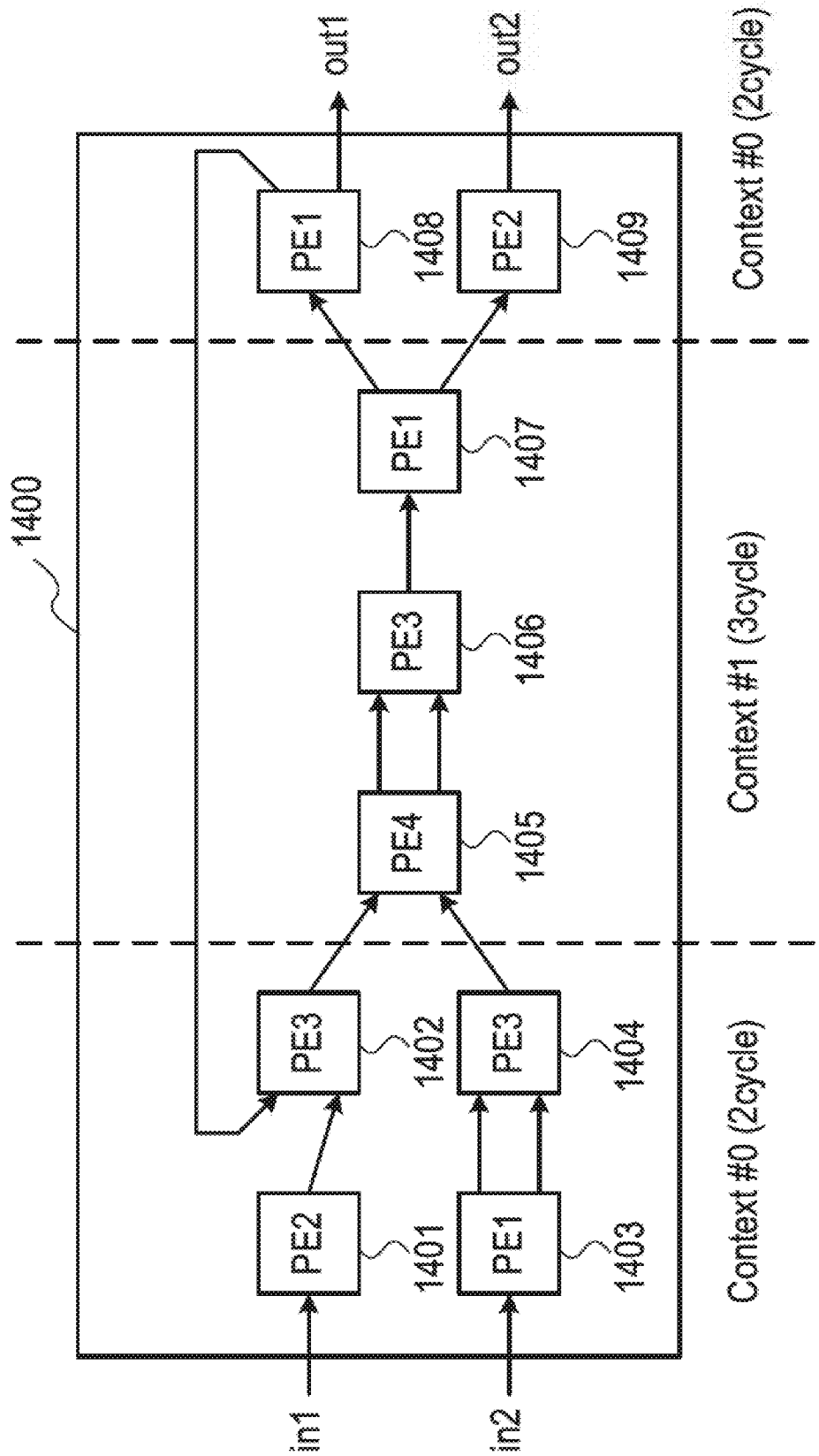
FIG. 14 is a data flow graph for illustrating another example of data conversion in the embodiment.

Here, consider a logical data flow graph 1400 composed of processing elements 1401 to 1409, as illustrated in FIG. 14, which is subjected to fragmented context switching. Comparing the number of processing elements that will be used with the real target machine, the data flow graph 1400 preferably has twice as many processing elements as the real target machine 1300. Thus, a virtual target machine 1310 illustrated in FIG. 13B is prepared. That is, the number of segments is two.

Next, the loop cycle is calculated. Since the logical data flow graph 1400 in FIG. 14 has a loop cycle of five cycles, data may be input to the data flow graph once in five cycles. When the number of segments is two and the loop cycle is five cycles, a two-plane context agrees with the loop cycle if the context is divided into two and three cycles in execution. Contexts are already allocated in FIG. 14, which is an example of when context number 0 (Context#0) is executed in two cycles and context number 1 (Context#1) is executed in three cycles.

Figure 15:
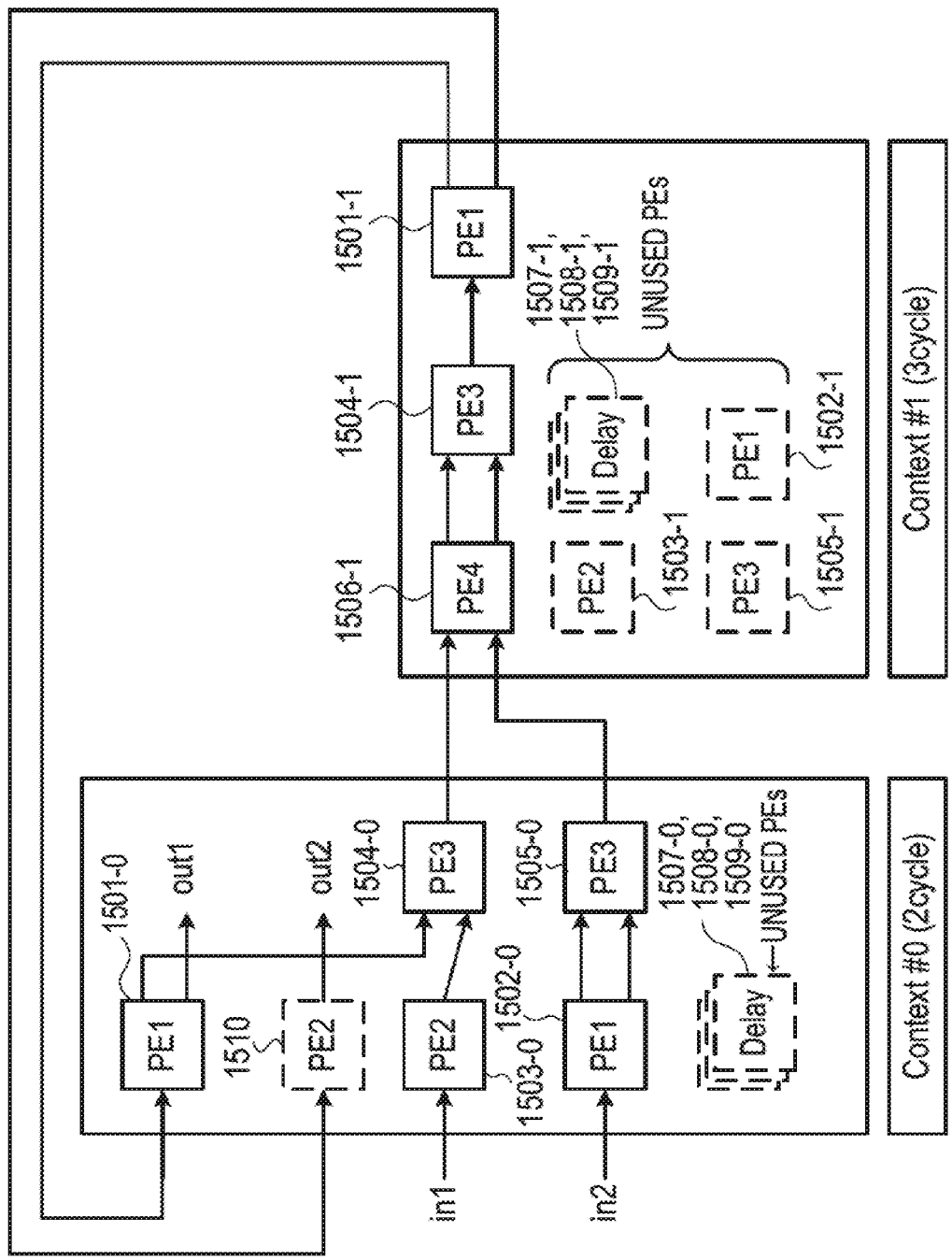
FIG. 15 is a diagram for illustrating another example of data conversion in the embodiment.

FIG. 15 illustrates a data flow graph in which processing elements for use in each context have been allocated based on FIG. 14. In FIG. 15, PE2 (1510) does not fit into a context in Context#0, whereas PE2 (1503-1) is redundant in Context#1. Thus, a Delay is inserted to allocate PE2 (1510) to Context#1. Here, a processing element to be moved is desirably a processing element on the output side in order to reduce flows at subsequent phases that will be affected by insertion of the Delay.

Figure 16:
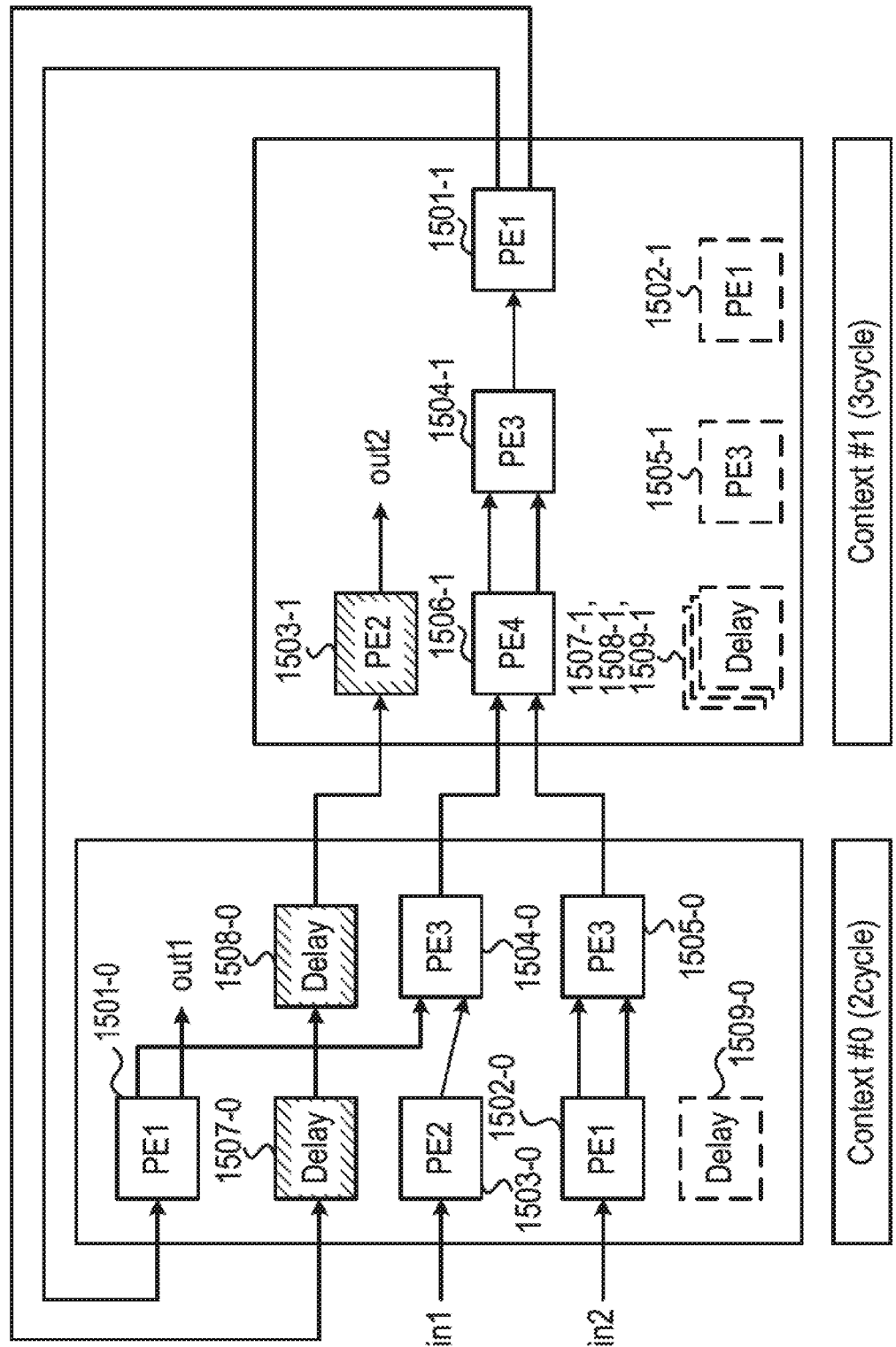
FIG. 16 is a diagram for illustrating another example of data conversion in the embodiment.
Figure 17:
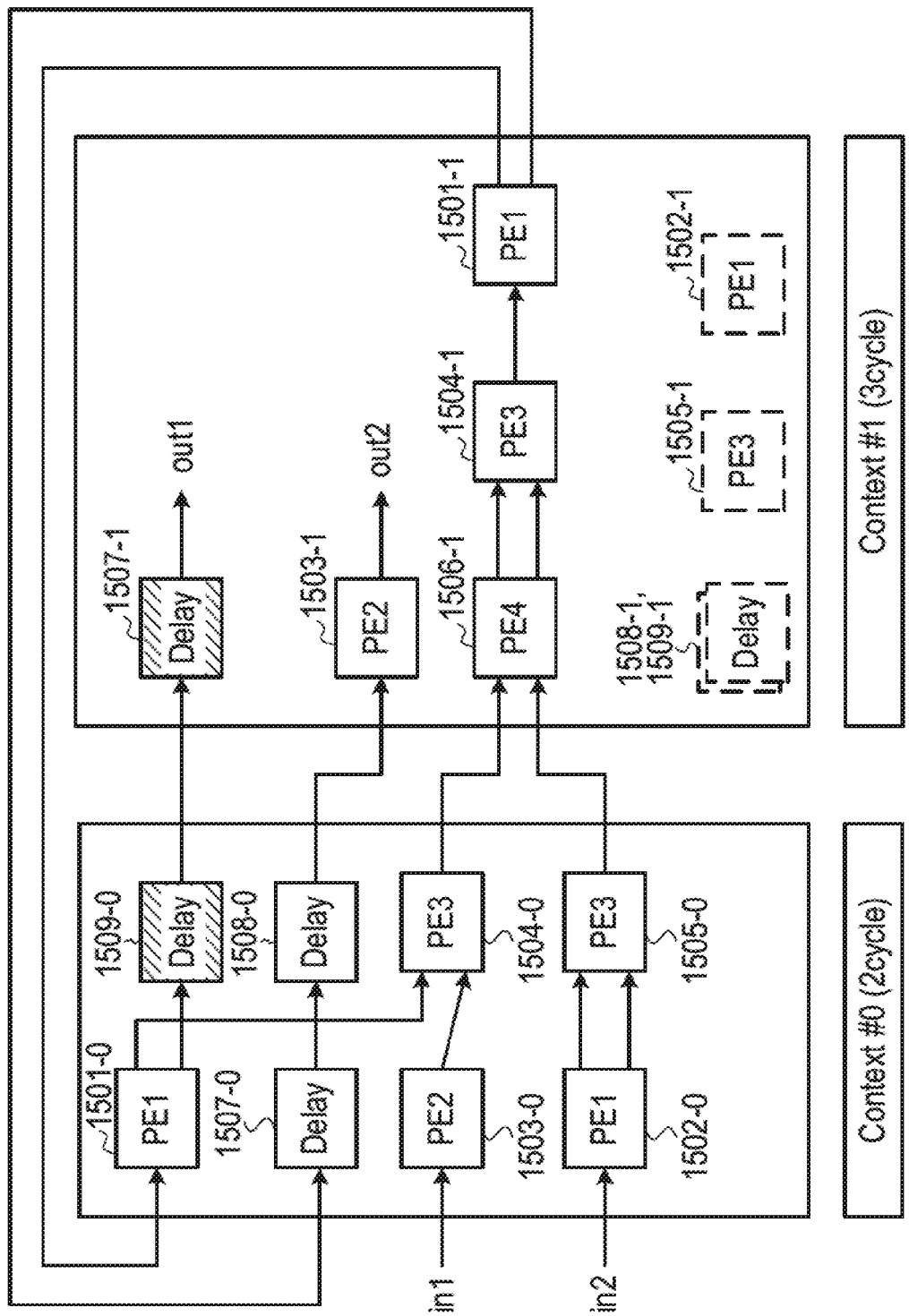
FIG. 17 is a diagram for illustrating another example of data conversion in the embodiment.
Figure 18:
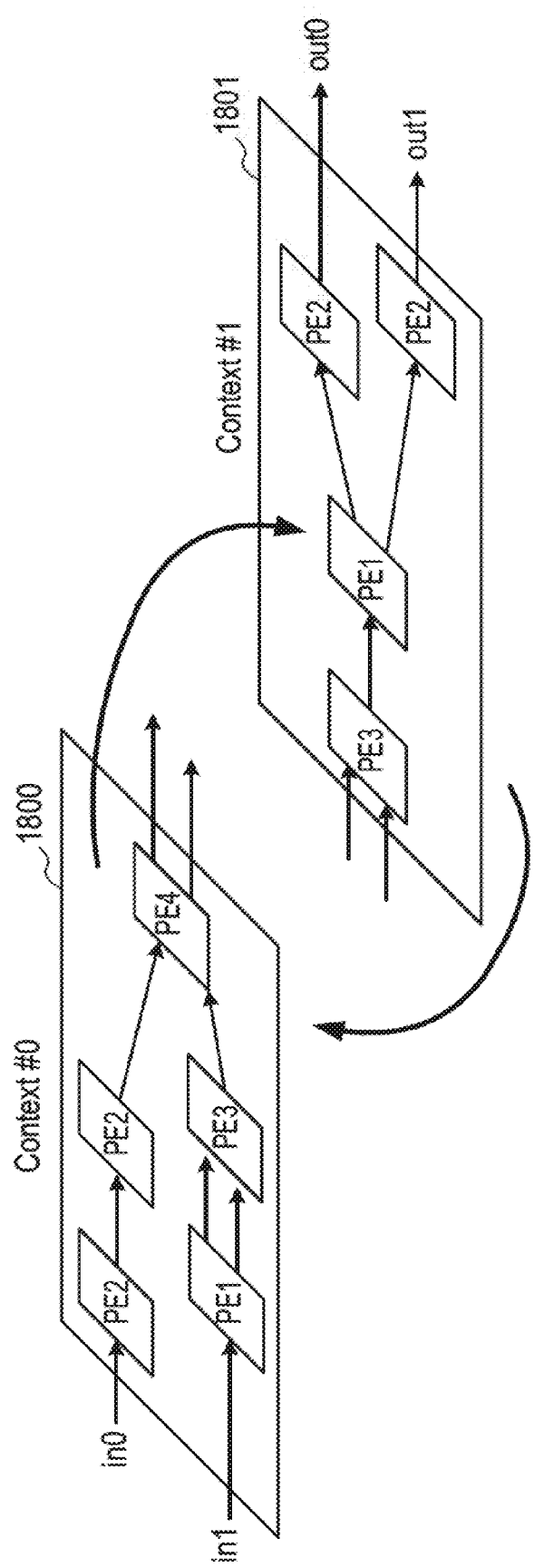
FIG. 18 is a diagram for illustrating conventional context switching.
Figure 19:
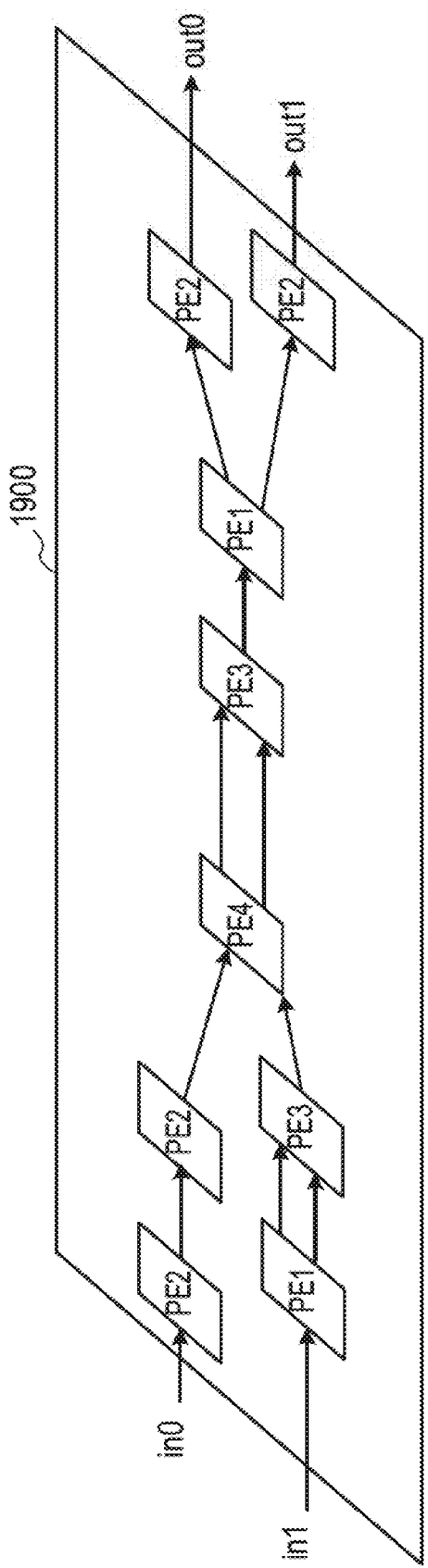
FIG. 19 illustrates a functional circuit realized by the context switching shown in FIG. 18.

FIG. 16 illustrates a data flow graph after the above-described adjustment where two Delays (1507-0, 1508-0) are used. Furthermore, to make output timings coincide with each other, two Delays (1509-0, 1507-1) are inserted for output, out1, as illustrated in FIG. 17. As the processing after the PE reset operation is similar to that in the example with no loopback, description thereof is omitted.

Processing operations related to data conversion described above may be configured with a CPU or MPU, RAM, ROM of a computer, or for example, may be realized by operation of a program stored in such RAM or ROM, the program being included in the embodiments of the invention. The operations may also be realized by recording a program for causing a computer to execute the functions on a recording medium, such as a CD-ROM, and causing the program to be read into the computer, where the recording medium on which the program is recorded is included in the embodiments of the present invention. The recording medium for recording the program may be a flexible disk, hard disk, magnetic tape, magneto-optical disk, non-volatile memory card or the like, in addition to a CD-ROM.

In addition, a program product that realizes the functions of the above-described embodiment through execution of a program and processing by a computer is included in the embodiments of the present invention. The program product may include a program itself that realizes the functions of the above-described embodiment, a computer into which the program has been read, a transmission apparatus capable of supplying the program to a computer that is communicatively connected via a network, a network system having such a transmission apparatus, or the like.

Also, not only when a computer executes a supplied program to realize the functions of the above-described embodiment, but also when the program operates in cooperation with an Operating System (OS) or other application software running on the computer to realize the functions of the above-described embodiment, or when all or part of processing of the supplied program is performed by a function extension board or a function extension unit of a computer to realize the functions of the embodiment, the program is also included in the embodiments of the present invention. In addition, for utilization of the present invention in a networking environment, all or some of such programs may be configured to be executed on another computer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A data conversion apparatus for converting an inputted circuit description related to a dynamically reconfigurable circuit to circuit configuration information, the data conversion apparatus comprising:
   a first generation section that generates a data flow graph from the circuit description;
   a segment count determining section that determines a number of segments for segmenting the data flow graph generated by the first generation section;
   a virtual circuit creating section that creates a virtual circuit that has as many resources of the dynamically-reconfigurable circuit as the number of the resources multiplied by the number of segments determined by the segment count determining section;
   a second generation section that generates, from the circuit description, a data flow graph corresponding to the virtual circuit created by the virtual circuit creating section;
   a conversion section that allocates and adjusts the resources of the virtual circuit in accordance with the data flow graph generated by the second generation section to generate the circuit configuration information; and
   a calculation section that calculates a loop cycle of the data flow graph corresponding to the virtual circuit,
   wherein the conversion section generates the circuit configuration information if a restriction of the dynamically-reconfigurable circuit is met as a result of the allocation and the adjustment of the resources of the virtual circuit in accordance with the data flow graph obtained by the second generation section, and
   wherein if the restrictions of the dynamically-reconfigurable circuit are not met as a result of the allocation and the adjustment of the resources of the virtual circuit in accordance with the data flow graph obtained by the second generation section, the conversion section increases the number of segments and again performs processing after determining the number of segments.

2. The data conversion apparatus according to claim 1, wherein adjustment performed by the conversion section in accordance with the data flow graph obtained by the second generation section includes at least one of: timing adjustment relating to data input and output to and from the resources of the virtual circuit, adjustment of deployment of the resources for use, or adjustment of wiring related to the resources.

3. The data conversion apparatus according to claim 1, wherein the segment count determining section determines the number of segments in accordance with the resources of the dynamically-reconfigurable circuit.

4. The data conversion apparatus according to claim 3, wherein if the number of segments is externally specified, the segment count determining section adopts the specified number of segments.

5. A data conversion method for converting an inputted circuit description related to a dynamically-reconfigurable circuit to circuit configuration information, the data conversion method comprising:
   a first generation process of generating a data flow graph from the circuit description;
   a segment count determining process of determining the number of segments for segmenting the data flow graph generated in the first generation process;
   a virtual circuit creating process of creating a virtual circuit that has as many resources of the dynamically-reconfigurable circuit as the number of the resources multiplied by the number of segments determined in the segment count determining process;
   a second generation process of generating, from the circuit description, a data flow graph corresponding to the virtual circuit created in the virtual circuit creating process;
   a conversion process of allocating and adjusting resources of the virtual circuit in accordance with the data flow graph generated in the second generation process to generate the circuit configuration information; and
   a calculation process of calculating a loop cycle of the data flow graph corresponding to the virtual circuit;
   wherein the data conversion method is to be executed by a computer,
   wherein the conversion process generates the circuit configuration information if a restriction of the dynamically-reconfigurable circuit is met as a result of the allocation and the adjustment of the resources of the virtual circuit in accordance with the data flow graph obtained by the second generation process, and wherein if the restrictions of the dynamically-reconfigurable circuit are not met as a result of the allocation and the adjustment of the resources of the virtual circuit in accordance with the data flow graph obtained by the second generation process, the conversion process increases the number of segments and again performs processing after determining the number of segments.

6. A computer-readable, non-transitory recording medium that stores therein a computer program for enabling a computer to execute:

a first generation step of generating a data flow graph from an inputted circuit description that is related to a dynamically-reconfigurable circuit;

a segment count determining step of determining the number of segments for segmenting the data flow graph generated in the first generation step;

a virtual circuit creating step of creating a virtual circuit that has as many resources of the dynamically-reconfigurable circuit as the number of the resources multiplied by the number of segments determined in the segment count determining step;

a second generation step of generating, from the circuit description, a data flow graph corresponding to the virtual circuit created in the virtual circuit creating step;

a conversion step of allocating and adjusting resources of the virtual circuit in accordance with the data flow graph generated in the second generation step to generate circuit configuration information for the dynamically-reconfigurable circuit; and a calculation step of calculating a loop cycle of the data flow graph corresponding to the virtual circuit, wherein the conversion step generates the circuit configuration information if a restriction of the dynamically-reconfigurable circuit is met as a result of the allocation and the adjustment of the resources of the virtual circuit in accordance with the data flow graph obtained by the second generation step, and wherein if the restrictions of the dynamically-reconfigurable circuit are not met as a result of the allocation and the adjustment of the resources of the virtual circuit in accordance with the data flow graph obtained by the second generation step, the conversion step increases the number of segments and again performs processing after determining the number of segments.

* * * * *